United States Patent
Shiu et al.

(10) Patent No.: US 11,282,712 B2
(45) Date of Patent: Mar. 22, 2022

(54) METHOD FOR PREVENTING BOTTOM LAYER WRINKLING IN A SEMICONDUCTOR DEVICE

(71) Applicant: TAIWAN SEMICONDUCTOR MANUFACTURING CO., LTD., Hsinchu (TW)

(72) Inventors: Jung-Hau Shiu, New Taipei (TW); Chung-Chi Ko, Nantou (TW); Tze-Liang Lee, Hsinchu (TW); Yu-Yun Peng, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 85 days.

(21) Appl. No.: 16/725,564

(22) Filed: Dec. 23, 2019

(65) Prior Publication Data

US 2020/0135488 A1    Apr. 30, 2020

Related U.S. Application Data

(62) Division of application No. 15/187,027, filed on Jun. 20, 2016, now Pat. No. 10,515,822.

(51) Int. Cl.

| | |
|---|---|
| *H01L 21/311* | (2006.01) |
| *H01L 21/02* | (2006.01) |
| *G03F 7/09* | (2006.01) |
| *H01L 21/768* | (2006.01) |

(52) U.S. Cl.
CPC ........ *H01L 21/31144* (2013.01); *G03F 7/094* (2013.01); *H01L 21/02164* (2013.01); *H01L 21/76808* (2013.01); *H01L 21/02274* (2013.01)

(58) Field of Classification Search
CPC ......... H01L 21/31144; H01L 21/76808; H01L 21/02164; H01L 21/02274; G03F 7/094
See application file for complete search history.

(56) References Cited

U.S. PATENT DOCUMENTS

| | | |
|---|---|---|
| 5,160,998 A | 11/1992 | Itoh et al. |
| 6,309,956 B1 | 10/2001 | Chiang et al. |
| 6,340,632 B1 | 1/2002 | Fukada et al. |
| 7,667,271 B2 | 2/2010 | Yu et al. |
| 7,910,453 B2 | 3/2011 | Xu et al. |
| 8,377,779 B1 | 2/2013 | Wang |

(Continued)

OTHER PUBLICATIONS

Non-final Office Action issued in related U.S. Appl. No. 15/187,027, dated Jul. 6, 2017.

(Continued)

*Primary Examiner* — Ahmed N Sefer
(74) *Attorney, Agent, or Firm* — McDermott Will & Emery LLP

(57) ABSTRACT

A method for manufacturing a semiconductor device includes forming a first insulating film over a semiconductor substrate and forming a second insulating film on the first insulating film. The first insulating film is a tensile film having a first tensile stress and the second insulating film is either a tensile film having a second tensile stress that is less than the first tensile stress or a compressive film. The first insulating film and second insulating film are formed of a same material. A metal hard mask layer is formed on the second insulating film.

20 Claims, 25 Drawing Sheets

(56) References Cited

U.S. PATENT DOCUMENTS

| | | |
|---|---|---|
| 8,399,931 B2 | 3/2013 | Liaw et al. |
| 8,647,991 B1 | 2/2014 | Liu et al. |
| 8,652,894 B2 | 2/2014 | Lin et al. |
| 8,686,516 B2 | 4/2014 | Chen et al. |
| 8,716,765 B2 | 5/2014 | Wu et al. |
| 8,723,272 B2 | 5/2014 | Liu et al. |
| 8,729,627 B2 | 5/2014 | Cheng et al. |
| 8,735,993 B2 | 5/2014 | Lo et al. |
| 8,736,056 B2 | 5/2014 | Lee et al. |
| 8,772,109 B2 | 7/2014 | Colinge |
| 8,785,285 B2 | 7/2014 | Tsai et al. |
| 8,816,444 B2 | 8/2014 | Wann et al. |
| 8,823,065 B2 | 9/2014 | Wang et al. |
| 8,860,148 B2 | 10/2014 | Hu et al. |
| 9,105,490 B2 | 8/2015 | Wang et al. |
| 9,847,221 B1 | 12/2017 | McLaughlin et al. |
| 2002/0094388 A1 | 7/2002 | Fonash et al. |
| 2003/0003741 A1 | 1/2003 | Ueda et al. |
| 2007/0037089 A1 | 2/2007 | Chang |
| 2007/0173072 A1 | 7/2007 | Takeuchi et al. |
| 2008/0139003 A1 | 6/2008 | Pirzada et al. |
| 2008/0157264 A1 | 7/2008 | Zhao et al. |
| 2013/0043512 A1 | 2/2013 | Huang et al. |
| 2013/0244434 A1* | 9/2013 | Lu .................... H01L 21/76819 438/694 |
| 2014/0001574 A1 | 1/2014 | Chen et al. |
| 2014/0001607 A1* | 1/2014 | Chuang ............. H01L 23/53295 257/637 |
| 2014/0110755 A1 | 4/2014 | Colinge |
| 2014/0151812 A1 | 6/2014 | Liaw |
| 2014/0151888 A1* | 6/2014 | Tsai .................. H01L 21/76831 257/762 |
| 2015/0140811 A1* | 5/2015 | Huang ............. H01L 21/31144 438/669 |
| 2016/0027687 A1 | 1/2016 | Greco et al. |
| 2016/0218016 A1* | 7/2016 | Hsieh .................. H01L 21/0273 |

OTHER PUBLICATIONS

Non-final Office Action issued in related U.S. Appl. No. 15/187,027, dated Jan. 4, 2018.

Final Office Action issued in related U.S. Appl. No. 15/187,027, dated Jun. 26, 2018.

Non-final Office Action issued in related U.S. Appl. No. 15/187,027, dated Mar. 14, 2019.

Final Office Action issued in related U.S. Appl. No. 15/187,027, dated Sep. 12, 2019.

Notice of Allowance issued in related U.S. Appl. No. 15/187,027, dated Nov. 6, 2019.

* cited by examiner

METHOD FOR PREVENTING BOTTOM LAYER WRINKLING IN A SEMICONDUCTOR DEVICE

CROSS-REFERENCE TO RELATED APPLICATION

This application is a Divisional Application of U.S. patent application Ser. No. 15/187,027, filed on Jun. 20, 2016, now U.S. Pat. No. 10,515,822, the entire disclosure of which is incorporated herein by reference.

TECHNICAL FIELD

The disclosure relates to a method for manufacturing a semiconductor device, and more particularly to a method for preventing bottom layer wrinkling in a semiconductor device.

BACKGROUND

As the semiconductor industry has progressed into nanometer technology process nodes in pursuit of higher device density, higher performance, and lower costs, challenges from both fabrication and design issues have greater. For example, multilayer resist structures are used for forming vias and interconnects above a semiconductor device, such as a FinFET transistor. As semiconductor devices become smaller, layers of the multilayer resist structure become thinner, and wrinkling of the layers becomes more pronounced relative to the thickness of the layer. Wrinkling of multilayer resist structures can cause problems in manufacturing semiconductor devices, such as FinFET devices.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
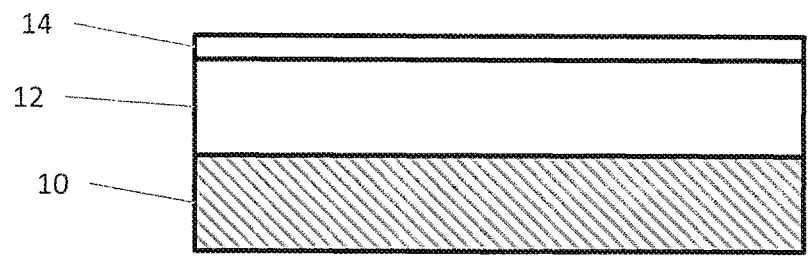
FIG. 1 depicts wrinkling of the bottom layer of a multilayer resist structure.
Figure 1:
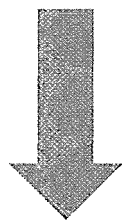
Figure 1:
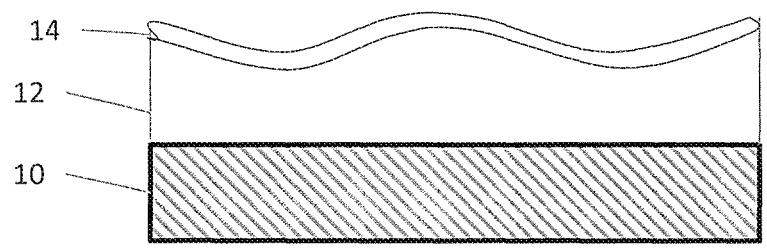

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of."

Various embodiments of the disclosure relate to semiconductor devices and methods for forming the same. In various embodiments, the semiconductor device includes FinFET and other MOS transistors. FinFET transistors are field effect transistors formed on fin structures formed over a substrate. In some embodiments, the fins are formed in an array.

The semiconductor devices include interconnect structures that include a plurality of interconnect pattern (line) layers having conductive patterns and interconnecting various features in one portion of the die to other features of the die. The interconnect structures are formed of conductive materials such as metal and the semiconductor devices include several interconnect layers in various embodiments. The interconnect layers are often referred to as "metal 1" or "M1" (designating the lowermost interconnect level), "metal 2", "metal 3", and so on. These designations are well known and used in the art to indicate that the conductive lines interconnect features from various locations in the semiconductor device. In some embodiments, the metal interconnect lines connect an array of FinFET transistors to other arrays or other features.

The interconnect layer patterns in different layers are also coupled to one another through vias that extend vertically between one or several interconnect layers. The interconnect layer patterns are coupled to external features and can represent bit lines, signal lines, word lines, and various input/output connections in some embodiments. In some embodiments of the disclosure, each of the interconnect structures is formed by a damascene process, in which a layer of inter-metal dielectric (IMD) material is deposited, trenches and vias are formed and filled with conductive material (e.g., copper or aluminum or various alloys) and the surface is planarized by chemical mechanical polishing (CMP), although other patterning techniques are used in other embodiments.

Examples of devices that can benefit from one or more embodiments of the present disclosure are semiconductor devices. Such a device, for example, may include static random access memory (SRAM) and/or other logic circuits, passive components such as resistors, capacitors, and inductors, and active components such as P-channel field effect transistors (PFET), N-channel FET (NFET), metal-oxide semiconductor field effect transistors (MOSFET), complementary metal-oxide semiconductor (CMOS) transistors, such as a FinFET transistor, bipolar transistors, high voltage transistors, high frequency transistors, other memory cells, and combinations thereof. The semiconductor device may include a plurality of semiconductor devices (e.g., transistors), which may be interconnected. It is understood, however, that the application should not be limited to a particular type of device, except as specifically claimed.

As a stiff thin film, such as low temperature (LT)-$SiO_2$, is deposited on a softer material, such as a bottom layer of a multilayer resist structure, compression induces buckling instability of the thin film, resulting in surface wrinkling, and poor planarization of a multilayer resist structure. The multilayer resist structures are used for forming vias and interconnects above a semiconductor device, such as a FinFET transistor. The multilayer resist structures include layers that act as sacrificial layers to improve the fidelity of pattern transfer processes. One or more layers of the multilayer resist can be used to prevent interaction between the photoresist layer and underlying low dielectric constant materials, thereby enhancing the robustness of the photoresist towards resist poisoning. Adverting to FIG. 1, a soft compliant material, such as a bottom anti-reflection coating (BARC) 12 having a thickness of about 200 nm is disposed on a rigid Si substrate 10. A thinner, stiff LT dielectric film 14 having a thickness of about 30 nm is disposed on the BARC 12. Film/substrate systems having a hard skin on a soft under layer are prone to surface wrinkling. When a stiff LT dielectric film 14 is bonded to a soft compliant BARC film 12, surface wrinkling occurs. Surface wrinkling can lead to inconsistent critical dimension of subsequently formed via lines.

LT dielectric films are formed at low temperature, such as between 100 and 200° C. The LT dielectric films are beneficial because they do not thermally damage the underlying bottom layer and they have etch selectivity to metal hard masks.

Figure 2:
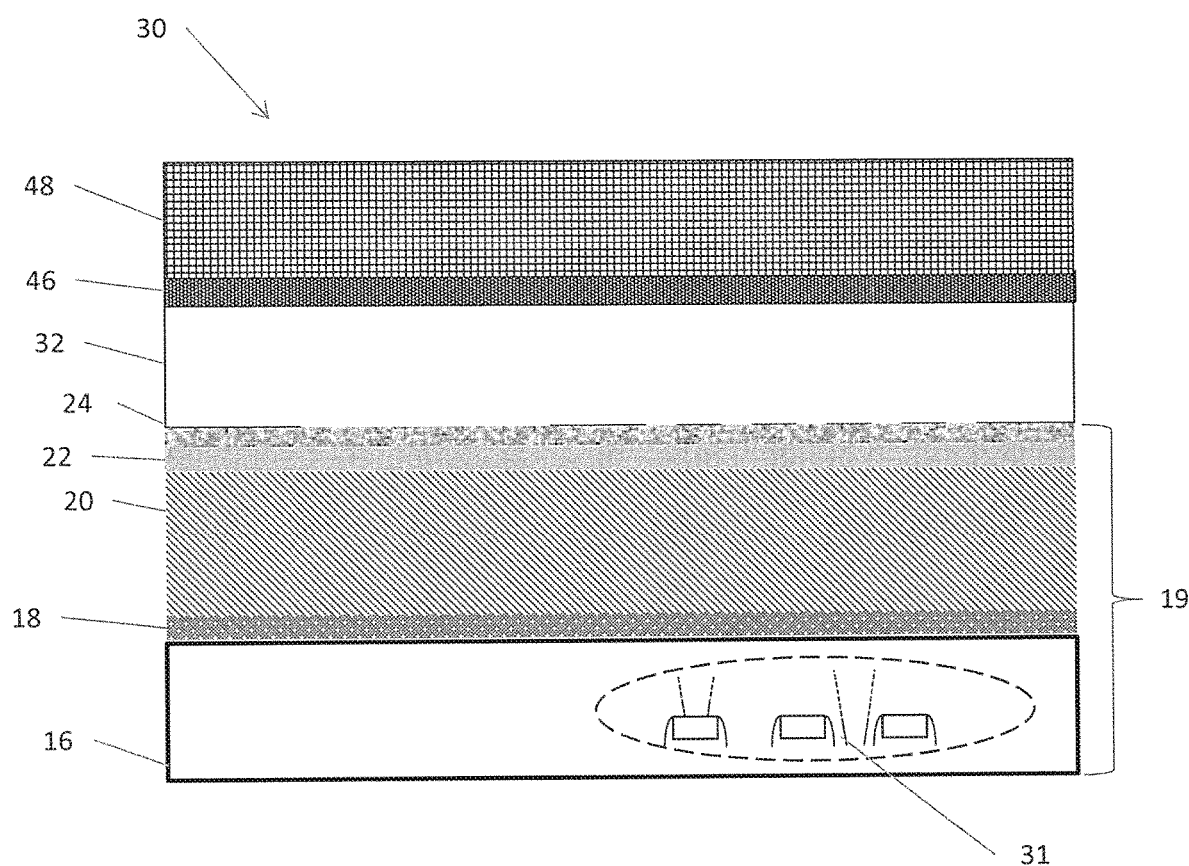
FIG. 2 illustrates a structure according to an embodiment of the present disclosure.

A multilayer structure 30 according to the present disclosure is illustrated in FIG. 2, and includes a bottom layer stack 32, a middle layer 46, and a photoresist layer 48 formed on an underlying structure 19. The underlying structure 19 includes semiconductor devices 31, such as field effect transistors, formed on a semiconductor substrate 16 in certain embodiments. Some embodiments have additional layers, including an etch stop layer 18, low-k dielectric layer 20, an anti-reflective coating (ARC) 22, and a nitride layer 24.

Figure 3:
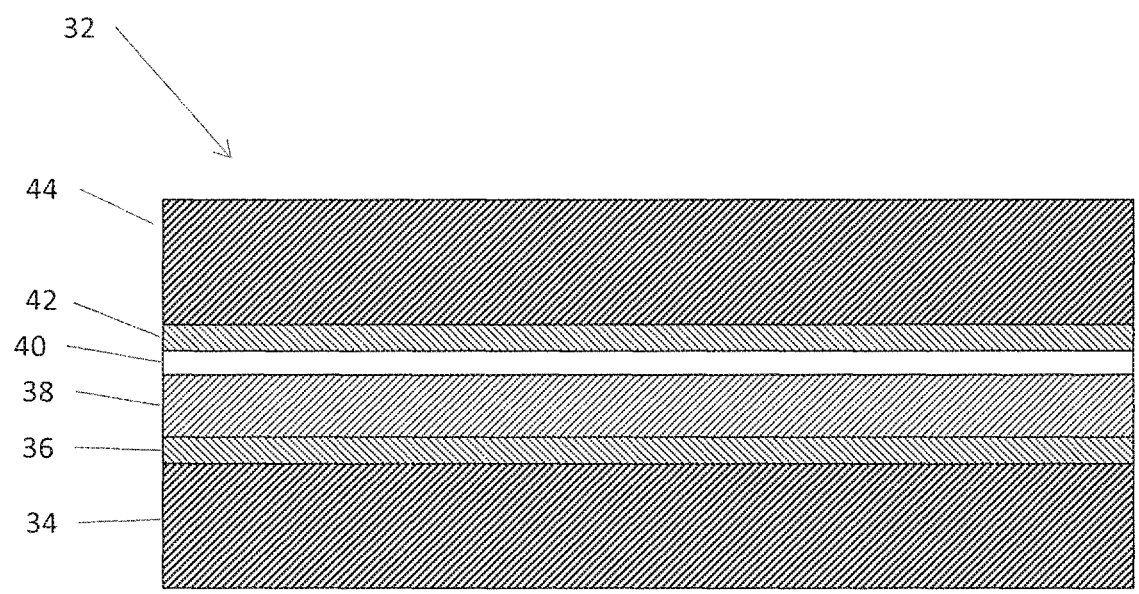
FIG. 3 illustrates a detailed view of a structure according to an embodiment of the present disclosure.

The bottom layer stack 32 further comprises a plurality of sublayers in certain embodiments, as illustrated in FIG. 3. The bottom layer stack 32 may include a first bottom layer 34, a first insulating film 36, a second insulating film 38, a metal hard mask layer 40, a third insulating film 42, and a second bottom layer 44.

The substrate 16 may be a semiconductor substrate, such as a semiconductor wafer. The substrate may include silicon in a crystalline structure. In alternative embodiments, the substrate includes germanium, silicon germanium, silicon carbide, gallium arsenide, indium arsenide, indium phosphide, and/or other suitable materials. The substrate may be a silicon-on-insulator (SOI) substrate. The substrate may include a plurality of layers and/or features formed on the semiconductor substrate including doped regions or wells, isolation regions such as shallow trench isolation (STI) features, conductive layers, insulating layers, and various other suitable features. For example, the substrate may include one or more target layers, which are desired to patterned. In certain embodiments, the substrate 16 has any plurality of layers (conductive layers, insulator layers) or features (source/drain regions, gate structures, interconnect lines and vias), formed thereon. The substrate 16 may include one or more target layers disposed on a semiconductor substrate. Exemplary target layers include gate layers, interconnect layers, and/or other suitable layers. In certain embodiments, the substrate 16 includes semiconductor devices, such as FinFETs.

The etch stop layer 18 may comprise any known etch stop material, including a silicon oxide, silicon nitride, silicon oxynitride, aluminum oxide, aluminum nitride, aluminum fluoride, titanium nitride, tantalum oxide, magnesium fluoride, and titanium silicon nitride.

A low-k dielectric layer 20 may be subsequently disposed over the etch stop layer 18. An ARC 22 may be disposed over the low-k dielectric to improve photolithographic pattern fidelity during a subsequent process step. In certain embodiments, the ARC is a nitrogen-free anti-reflection coating comprising an organic material. A nitride layer 24, such as a TiN layer, may be subsequently disposed over the ARC 22.

The expression "low-k" material refers to materials with a dielectric constant less than about 3.9. Suitable low-k dielectric materials include flowable oxides which are basically ceramic polymers, such as hydrogen silsesquioxane (HSQ). HSQ-type flowable oxides have been considered for gap filling between metal lines because of their flowability and ability to fill small openings. Additional low-k dielectrics include organic low-k materials, typically having a dielectric constant of about 2.0 to about 3.8. Organic low-k materials include a poly(arylene) ether, BCB (divinylsiloxane bis-benzocyclobutene), and organic-doped silica glasses (OSG) (also known as carbon-doped glasses). Other suitable types of low-k dielectrics are fluorine-doped silica glasses (FSG) and SiCOH. FSG include dielectrics formed from precursor gases $SiF_4$, $SiH_4$, and $N_2O$ and dielectrics formed from the precursors $SiF_4$, tetraethylorthosilicate (TEOS), and $O_2$. Dielectrics formed from TEOS and $SiF_4$ are known as fluorinated TEOS or FTEOS.

Figure 4:
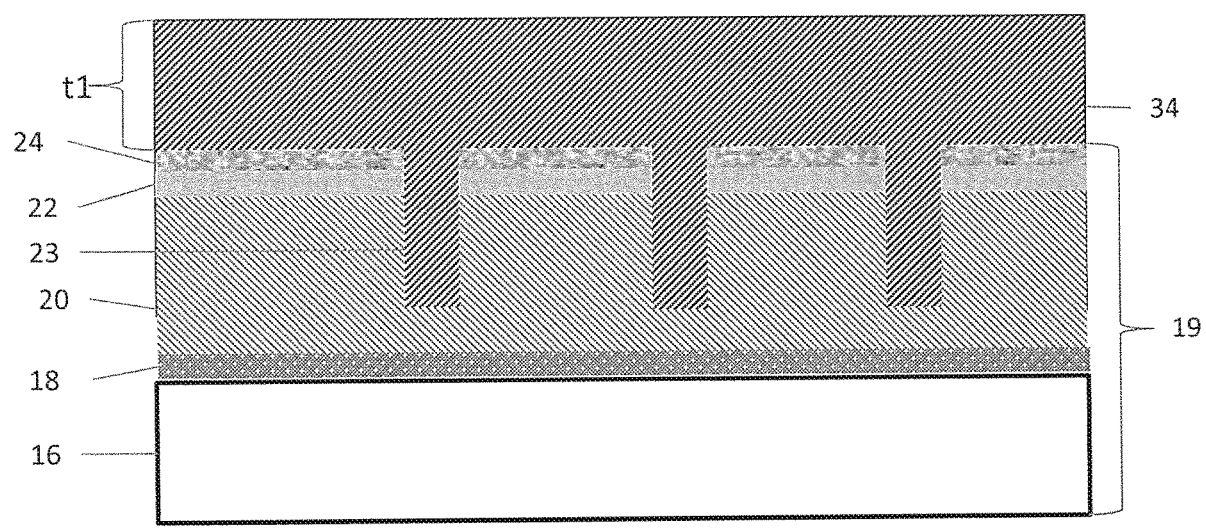
FIGS. 4-19 illustrate a method for manufacturing a semiconductor device according to an embodiment of the present disclosure.

A method for manufacturing a semiconductor device having reduced wrinkling of a bottom layer stack 32 of a multilayer resist structure will be explained with reference to FIGS. 4-19. The nitride layer 24, anti-reflective layer 22, and low-k dielectric layer 20 are patterned to form openings 23 in some embodiments. The patterning is performed by suitable lithographic and etching operations. The openings 23 arrangement depicted in FIG. 4 is for illustrative purposes. The present disclosure is not limited to any particular pattern. The openings 23 are subsequently filled with the first bottom layer material when the bottom layer 34 is formed.

In certain embodiments, a first bottom layer 34 of the bottom layer stack 32 is formed on the nitride layer 24, as shown in FIG. 4. In certain embodiments, the first bottom layer 34 is organic. The organic material may include a plurality of monomers or polymers that are not cross-linked. Generally, the first bottom layer may contain a material that is patternable and/or have a composition tuned to provide anti-reflection properties. Exemplary materials for the first bottom layer include carbon backbone polymers. The first bottom layer 34 is used to planarize the structure, as the underlying structure may be uneven depending on the structure of the devices 31 formed on the substrate 16. In some embodiments, the first bottom layer 34 is formed by a spin coating process. In other embodiments, the first bottom layer 34 is formed by another suitable deposition process.

In certain embodiments, the thickness t1 of the first bottom layer 34 ranges from about 100 nm to about 500 nm as measured from the top of the nitride layer 24. In other embodiments, the thickness t1 of the first bottom layer 34 ranges from 150 to 300 nm as measured from the top of the nitride layer 24.

Figure 5:
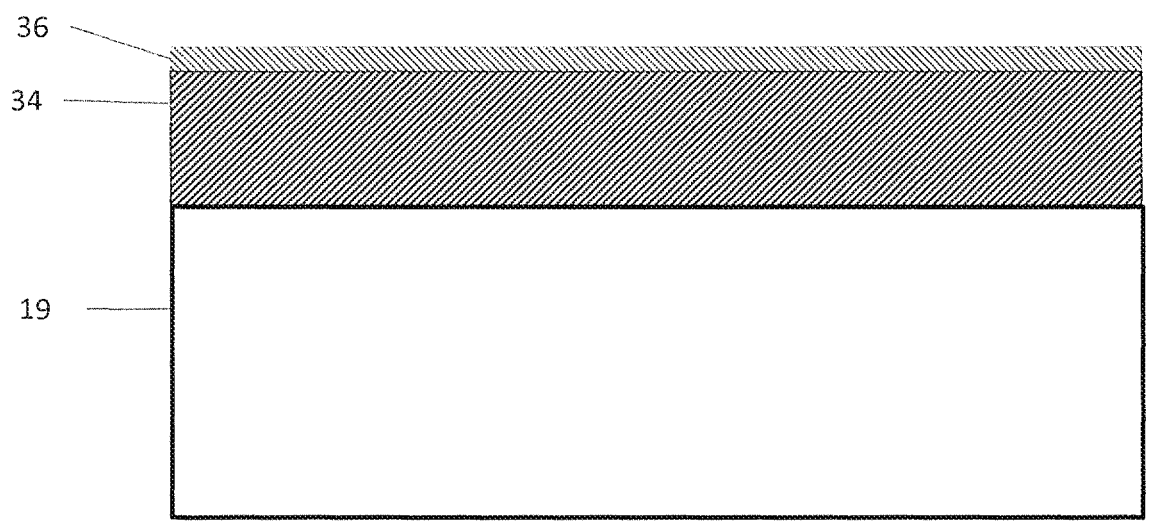

To simplify the subsequent disclosure, the underlying structure 19 will be represented as a single layer in FIGS. 5-11 and 20-24. In certain embodiments, a first insulating film 36 is disposed over the first bottom layer 34, as shown in FIG. 5. The first insulating film 36 is formed by a low-temperature deposition process to form a tensile film having a first tensile stress. The low-temperature deposition process is performed at a temperature of about 100° C. to about 200° C. in certain embodiments.

Figure 6:
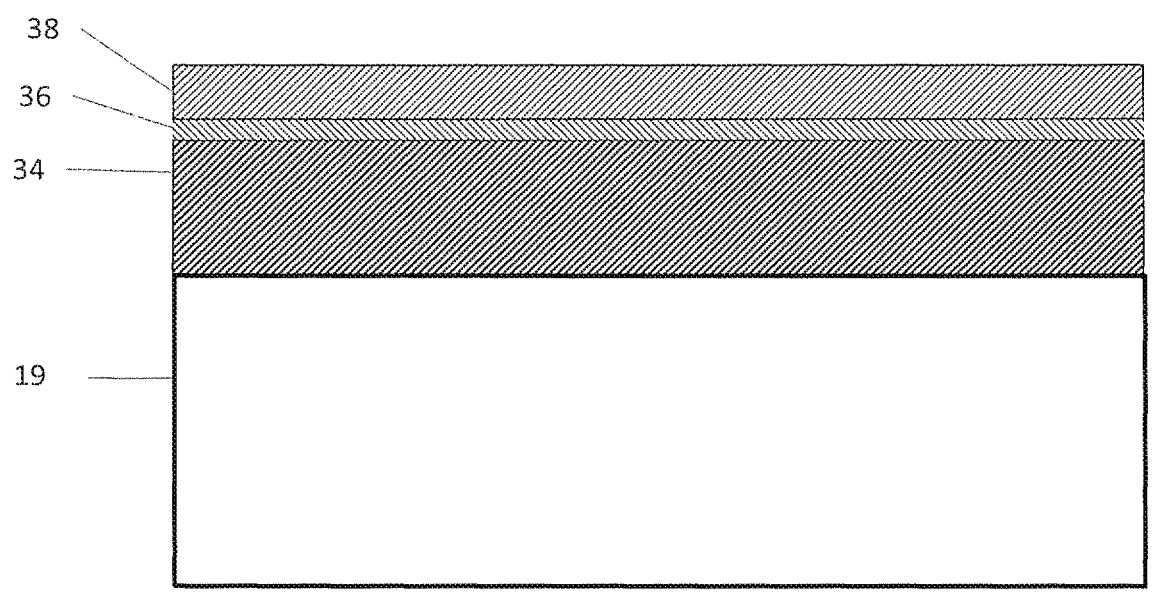

Adverting to FIG. 6, a second insulating film 38 is formed overlying the first insulating film 36 by a low-temperature deposition process to form a film having either a second tensile stress or a compressive stress. The second tensile stress is less than first tensile stress. In certain embodiments, the first insulating film 36 has a tensile stress ranging from about 75 MPa to about 25 MPa, and the second insulating film 38 has a tensile stress ranging from about 20 MPa to about −50 MPa. The first insulating film 36 inhibits wrinkling of the bottom layer stack 32, while the second insulating film 38 improves etch selectivity relative to a subsequently formed metal hard mask overlying the second insulating film 38. In some embodiments, different tensile stresses of the first insulating film 36 and the second insulating film 38 are provided by changing a plasma power condition of the deposition operation.

The first insulating film 36 and second insulating film 38 may be formed of the same material. In certain embodiments, the first insulating film and second insulating film are oxide films, such as silicon oxide films. The first insulating film 36 may have a thickness ranging from about 10 nm to about 50 nm, and the second insulating film 38 may have a thickness ranging from about 100 nm to about 500 nm. The first and second insulating films may be formed by any suitable deposition process, including atomic layer deposition (ALD), physical vapor deposition (PVD), chemical vapor deposition (CVD), and plasma-enhanced chemical vapor deposition (PECVD). In certain embodiments, the second insulating film 38 is formed by a different deposition process than the first insulating film 36.

Figure 7:
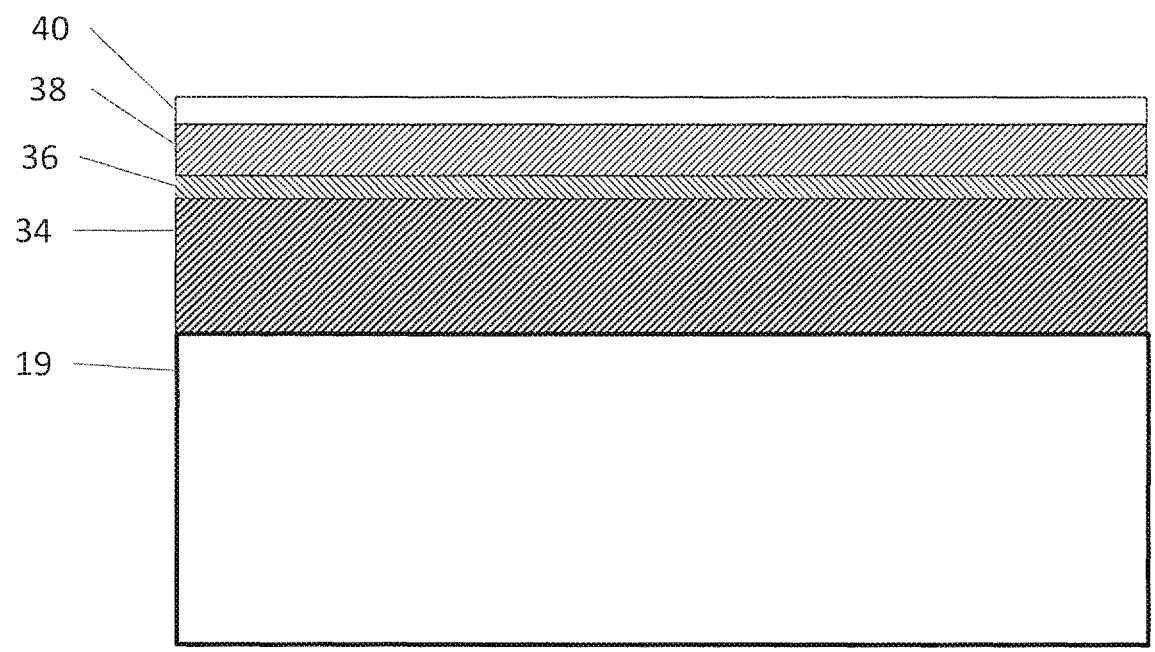

In a certain embodiment, a metal hard mask layer 40 is disposed overlying the second insulating film 38, as shown in FIG. 7. The metal hard mask layer 40 is used to transfer patterns into the underlying first and second insulating films 36, 38, and therefore, has a lower etch rate than the first and second insulating films 36, 38. The difference in etch rate between the metal hard mask layer 40 and the first and second insulating films 36, 38 produces improved vertical openings when etching the first and second insulating films 36, 38. The metal hard mask layer 40 also prevents damage to the first bottom layer 34 during subsequent processing. The metal hard mask layer 40 may comprise titanium nitride deposited by a PVD process. A thickness of the metal hard mask layer 40 may range from about 10 to about 50 nm. In other embodiments, the hard mask is any suitable hard mask material, including TiO, SiOC, and SiN.

Figure 8:
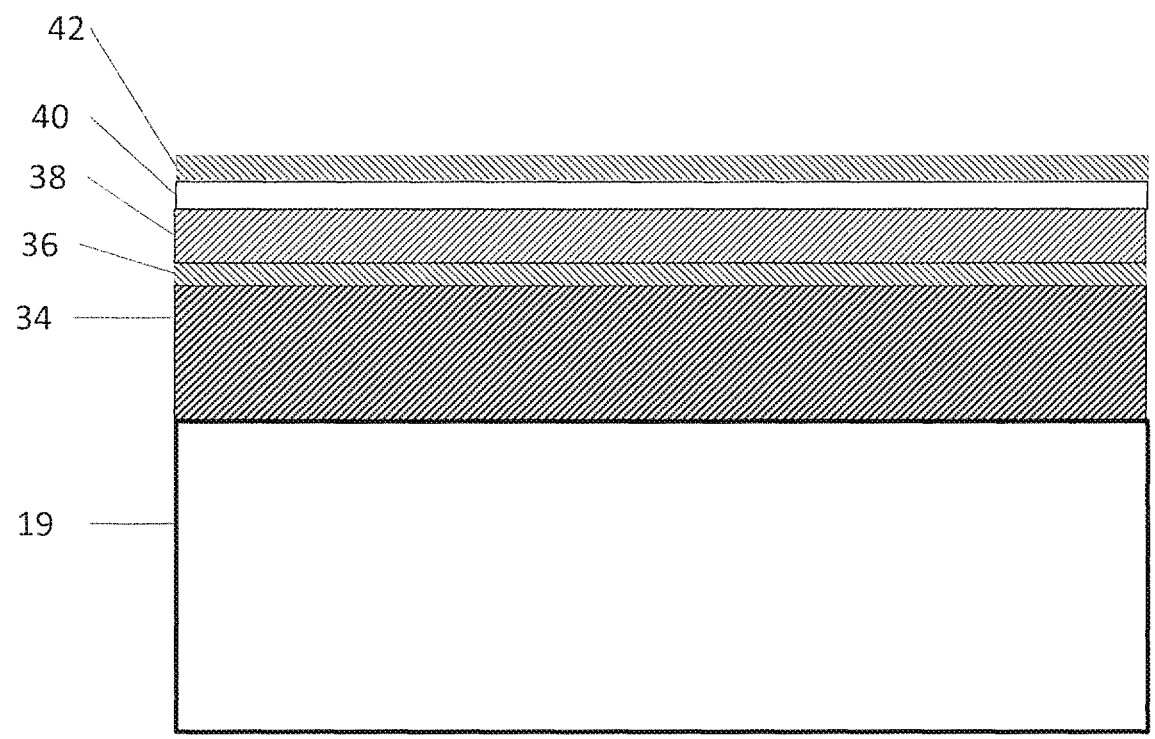

In some embodiments, a third insulating film 42 is formed on the metal hard mask layer 40, as shown in FIG. 8. The third insulating film may be the same material as the first and second insulating films 36, 38. The third insulating film 42 is formed by a low-temperature deposition process at a temperature of about 100° C. to about 200° C. A thickness of the third insulating film 42 may range from about 10 to about 50 nm. The third insulating film 42 prevents damage to the hard mask layer 40 during subsequent processing of overlying layers, such as ashing of a second bottom layer.

Figure 9:
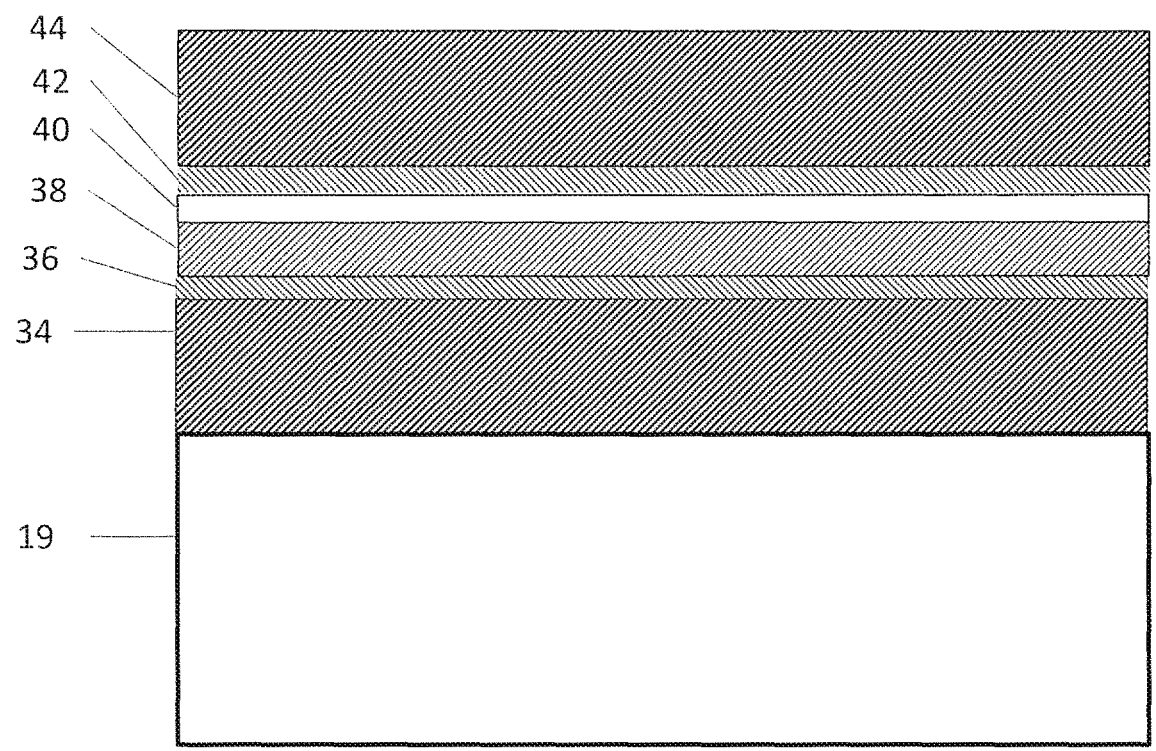

Adverting to FIG. 9, a second bottom layer 44 is formed on the third insulating film 42, thereby forming the bottom layer stack 32 in certain embodiments. The second bottom layer 44 may formed of an organic material, and may include the same composition as the first bottom layer 34. The thickness of the second bottom layer 44 may range from about 100 nm to about 500 nm. In certain embodiments, the thickness of the second bottom layer 44 is from 150 to 300 nm.

Figure 10:
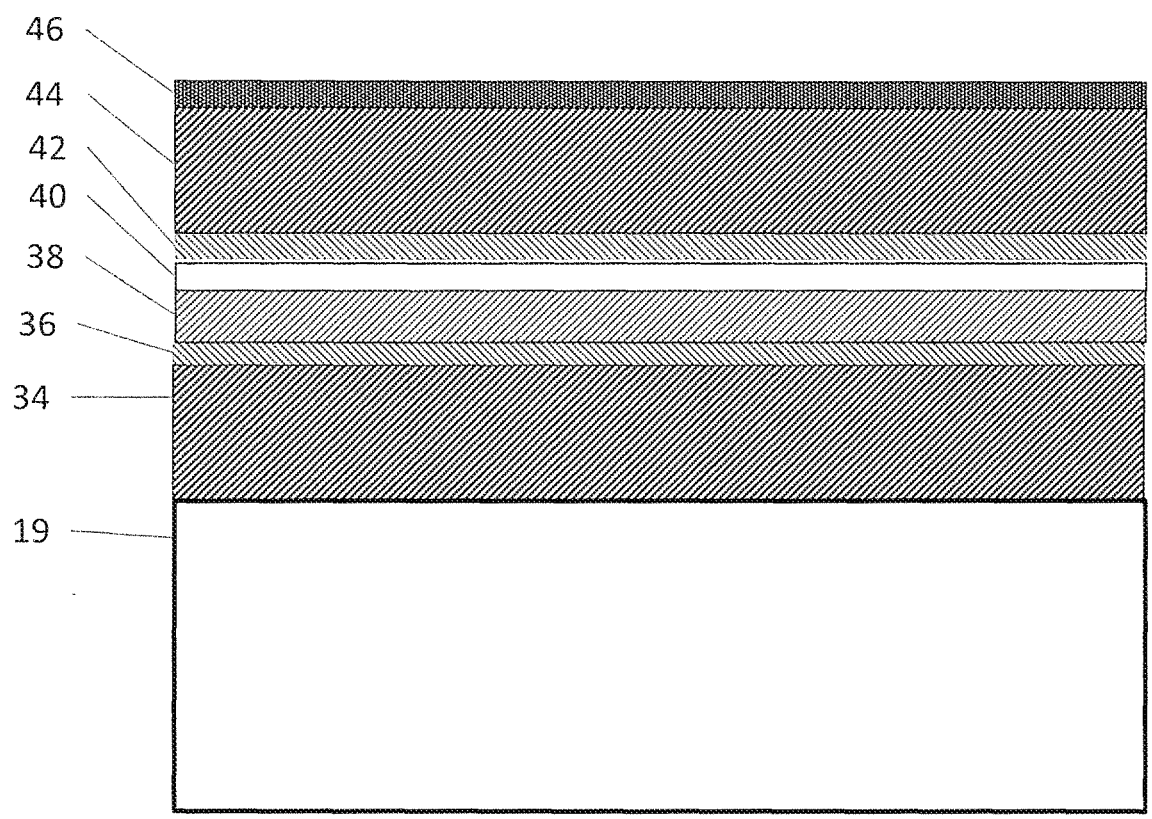

A middle layer 46 is formed on the second bottom layer 44, as shown in FIG. 10. The middle layer 46 of the multilayer resist structure may have a composition that provides anti-reflective properties and/or hard mask properties for the photolithography process. In some embodiments, the middle layer 46 includes a silicon containing layer (e.g., a silicon hard mask material). The middle layer 46 may include a silicon-containing inorganic polymer. In other embodiments, the middle layer includes a siloxane polymer. In other embodiments, the middle layer 46 includes silicon oxide (e.g., spin-on glass (SOG)), silicon nitride, silicon oxynitride, polycrystalline silicon, a metal-containing organic polymer material that contains metal such as titanium, titanium nitride, aluminum, and/or tantalum; and/or other suitable materials. The middle layer 46 may be bonded to adjacent layers, such as by covalent bonding, hydrogen bonding, or hydrophilic-to-hydrophilic forces.

Thus, the middle layer 46 may include a composition that allows for a covalent bond to be formed between the middle layer and the overlying photoresist 48 after an exposure process and/or subsequent baking process. In some embodiments, the middle layer 46 includes an additive compound or component having a photo base generator (PBG). This PBG generates a base that interacts with the exposed photoresist and provides for covalent bonding between the middle layer and a component of the overlying photoresist. In some embodiments, the middle layer 46 comprises a siloxane polymer and a PBG.

Exemplary photo-base generators include components that generate amines and sulfur (sulfur ions S—) bases. Other PBGs include carbamates, O-acyloximes, ammonium salts, amineimides, α-aminoketones, amidine precursors, aromatic ureas, and trimethylbenzhydrylammonium iodide.

The middle layer 46 may be formed by a spin-on coating process, chemical vapor deposition process (CVD), physical vapor deposition (PVD) process, and/or other suitable deposition processes.

Figure 11:
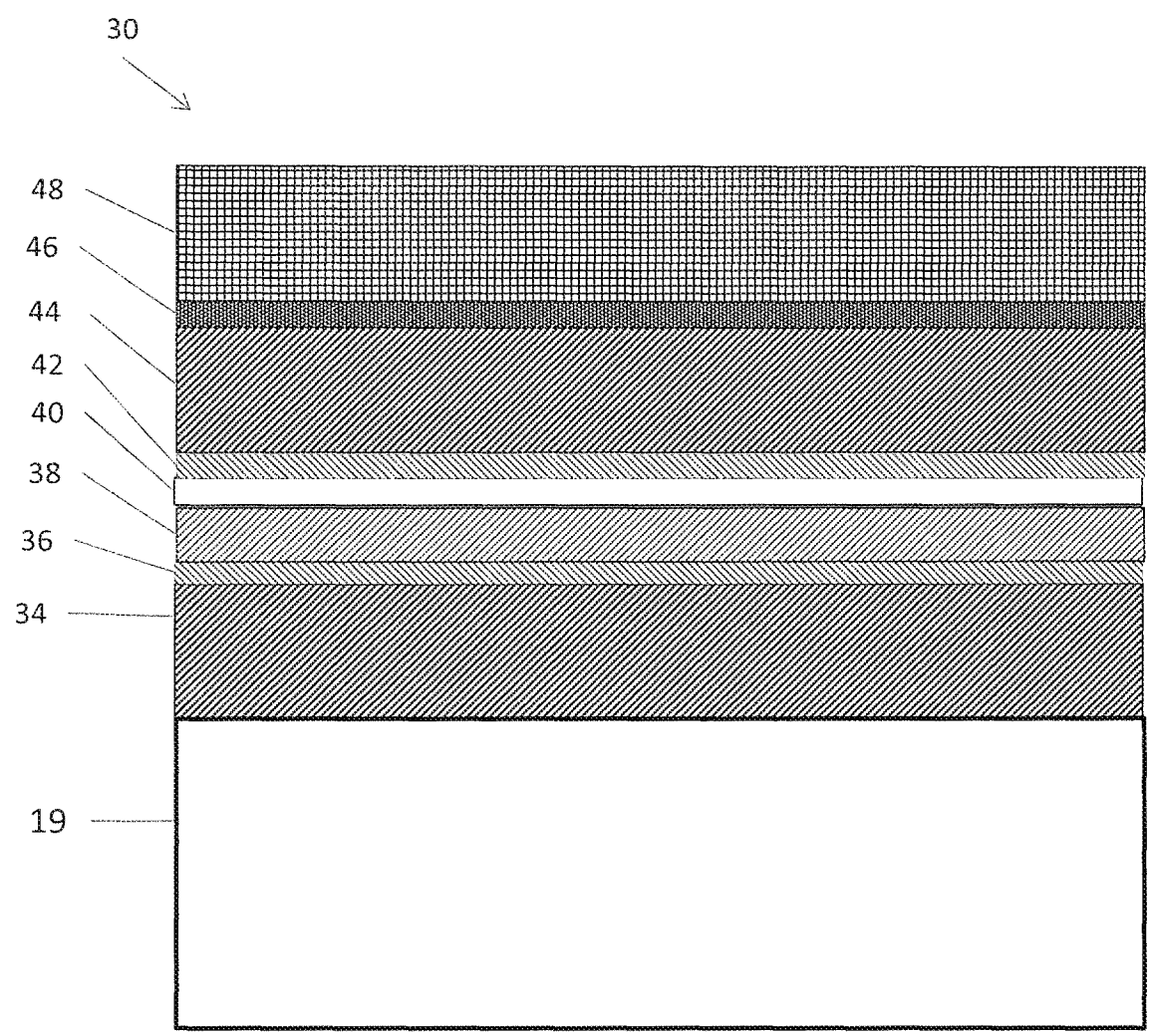

A photoresist layer 48 is subsequently formed over the middle layer 46. The photoresist layer 48 may be a third, and top, layer of a multilayer resist structure, as depicted in FIG. 11. The photoresist layer 48, middle layer 46, and second bottom layer 44 together may form a conventional trilayer resist.

The photoresist layer 48 may be a photosensitive layer which can be patterned by actinic radiation, as known in the art. Typically, the chemical properties of the photoresist regions struck by incident radiation change in a manner that depends on the type of photoresist used. In some embodiments, the photoresist layer 48 is a positive resist. Positive resist refers to a photoresist material that when exposed to radiation (typically UV light) becomes soluble in a developer, while the portion of the photoresist that is non-exposed (or exposed less) is insoluble in the developer. In other embodiments, the photoresist layer 48 is a negative resist.

Negative resist refers a photoresist material that when exposed to radiation becomes insoluble in the developer, while the portion of the photoresist that is non-exposed is soluble in the developer.

The photoresist layer 48 may include a carbon backbone polymer, and other suitable components such as a solvent and/or photo acid generators. For example, in some embodiments, the photoresist layer 48 is a known chemical amplified resist.

In some embodiments, after deposition, a soft bake process is performed on the photoresist layer 48. The photoresist layer 48 is subsequently exposed to actinic radiation in a patternwise manner thereby forming a latent image in the photoresist layer 48. The actinic radiation may be generated by a lithography system that provides a pattern of the radiation according to an integrated circuit design layout. In some embodiments, a lithography system includes ultraviolet (UV) radiation, deep ultraviolet (DUV) radiation, extreme ultraviolet (EUV) radiation, X-ray radiation, and/or other suitable radiation types. In alternative embodiments, a lithography system includes a charged particle lithography system, such as an electron beam or an ion beam lithography system.

Figure 12:
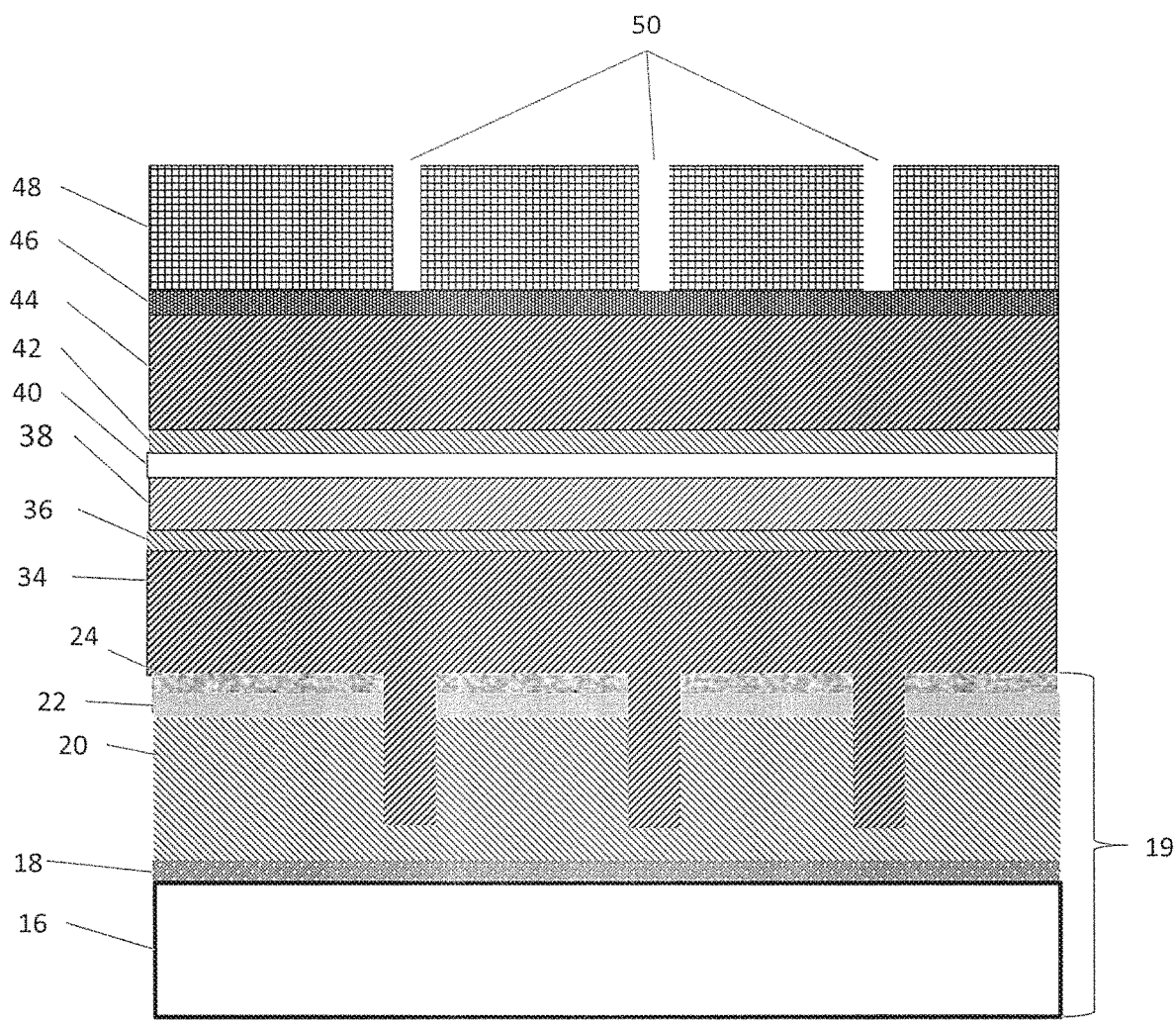

In some embodiments, after the exposure operation, a hard baking operation occurs. The exposed photoresist layer 48 is subsequently developed to form a pattern 50, as depicted in FIG. 12, by applying a developer to the exposed photoresist layer 48. The developer is a solvent, and may be sprayed on the exposed photoresist film. The pattern 50 depicted in FIG. 12 is for illustrative purposes. The pattern 50 according to the present disclosure is not limited to any specific pattern.

Figure 13:
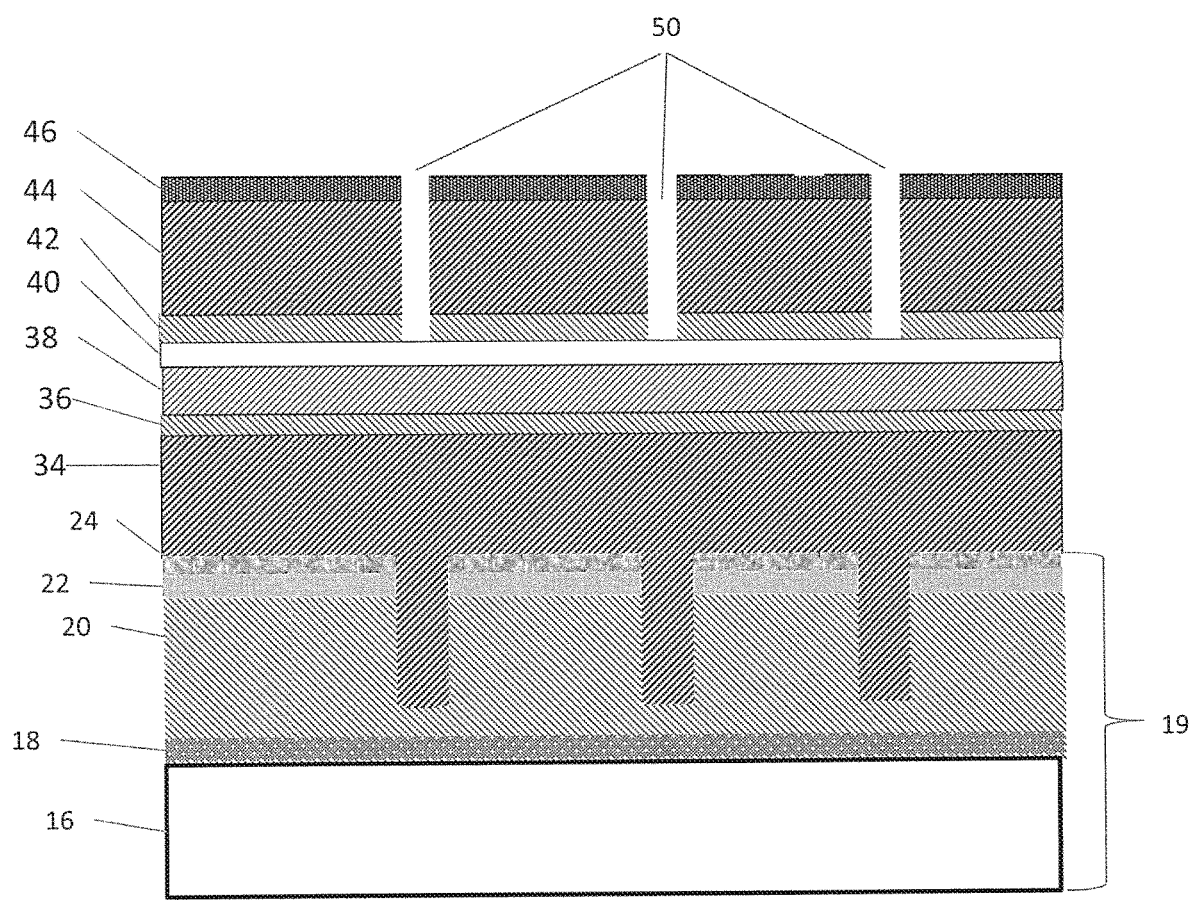
Figure 14:
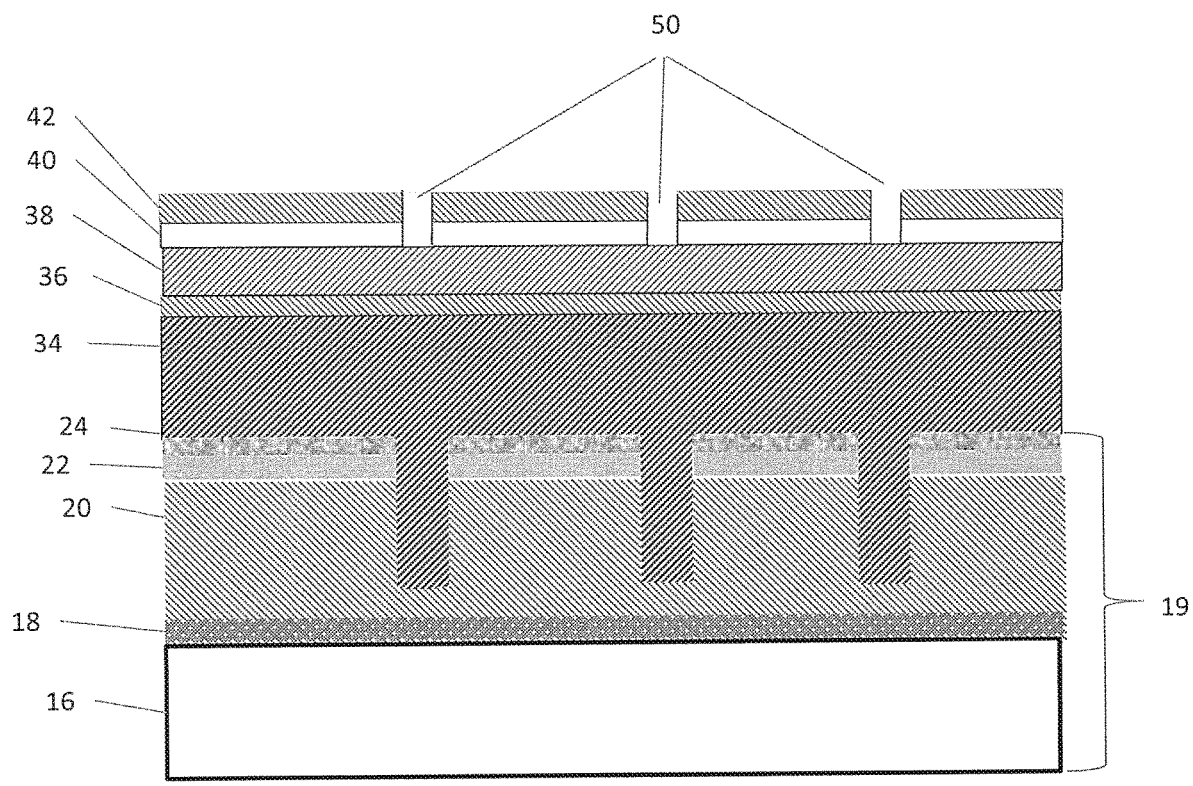

The pattern 50 in the photoresist layer may be subsequently transferred to the other layers of the multilayer resist structure and into the underlying layers to form vias using conventional etching and resist removal operations. For example, as shown in FIG. 13, the pattern is transferred into the middle layer 46, second bottom layer 44, and the third insulating film 42 using appropriate etchants and etching operations for each layer, and the photoresist layer 48 is removed. The middle layer 46 and second bottom layer 44 are subsequently removed after the pattern 50 is transferred through the third insulating film 42, and the pattern 50 is subsequently transferred through the metal hard mask layer 40 using appropriate etchants and etching operations, as shown in FIG. 14.

Figure 15:
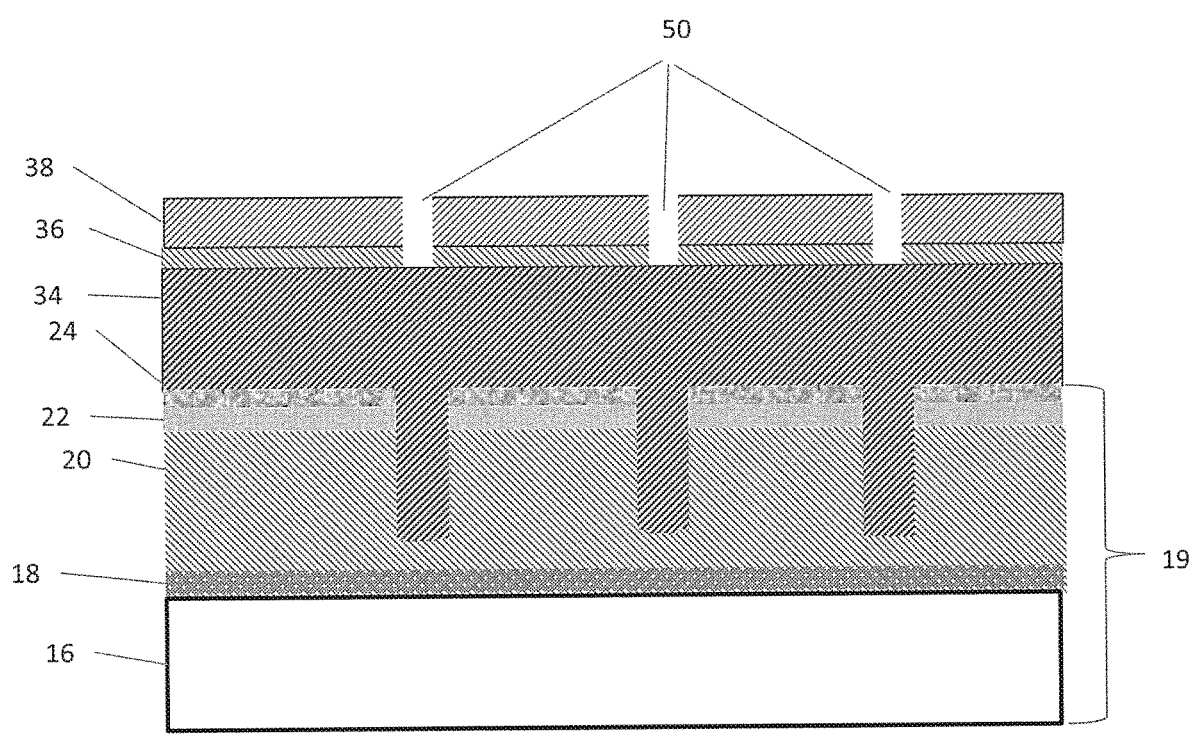
Figure 16:
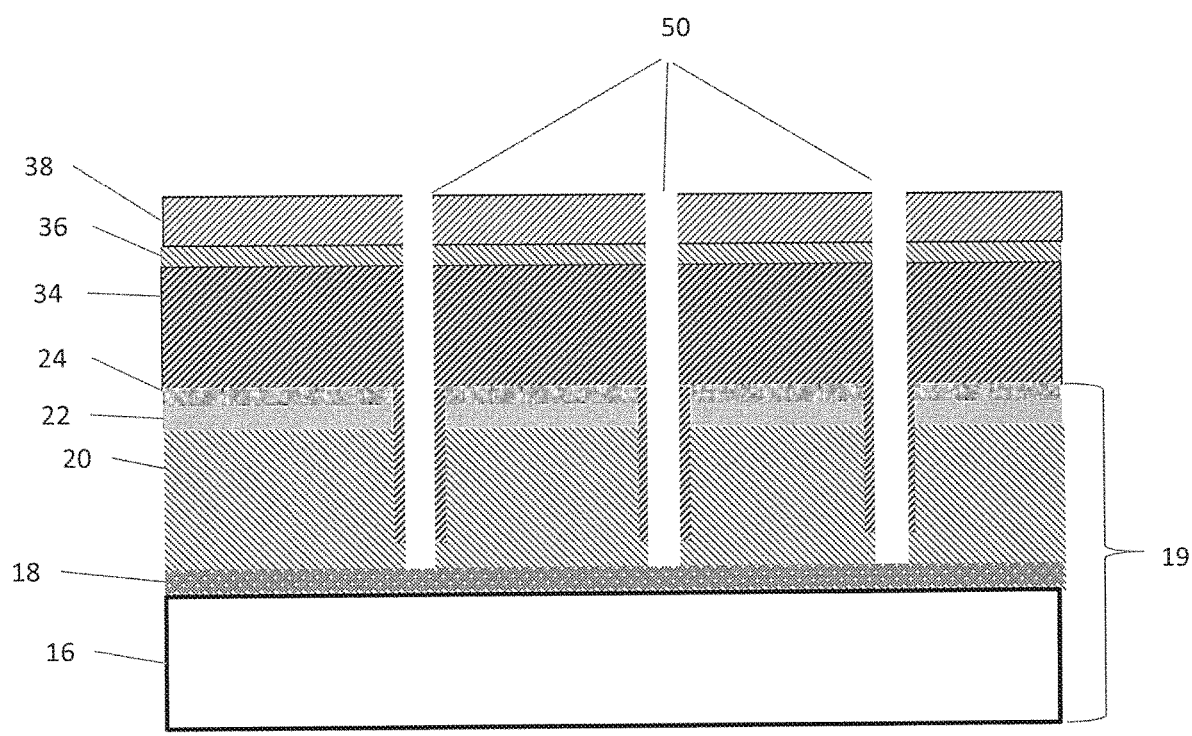
Figure 17:
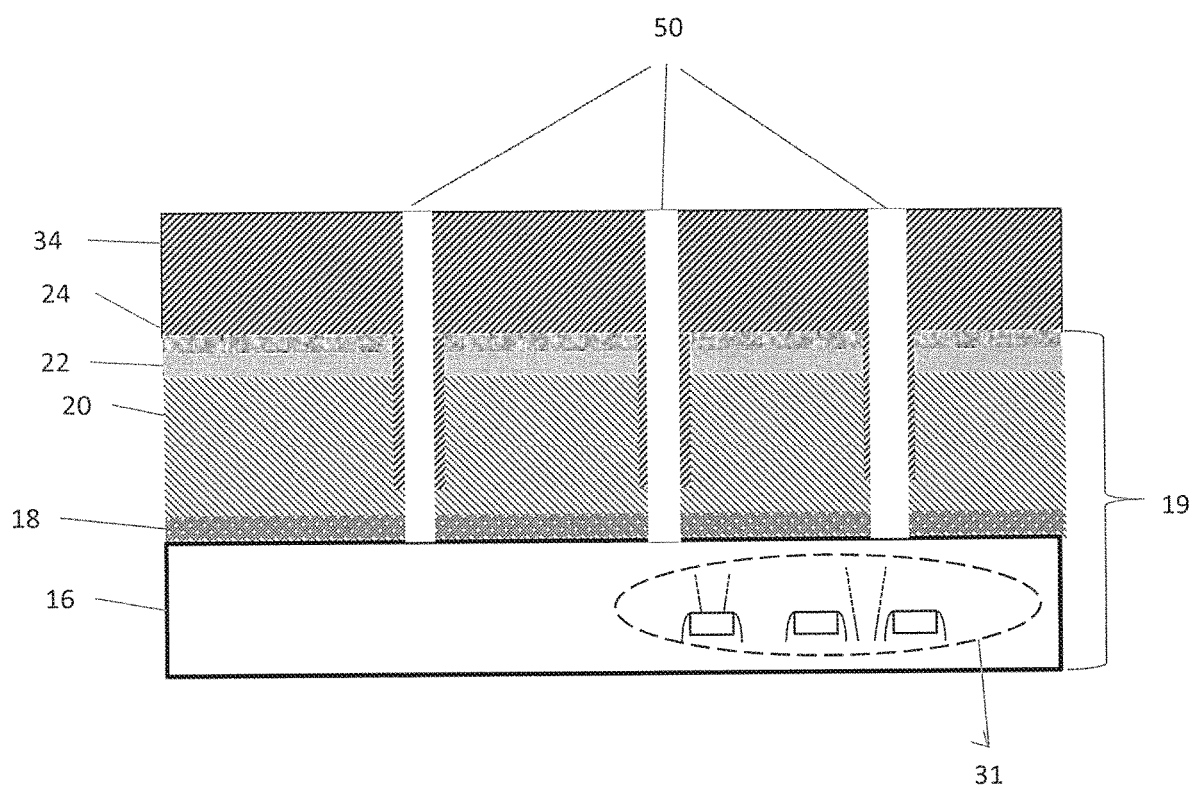
Figure 18:
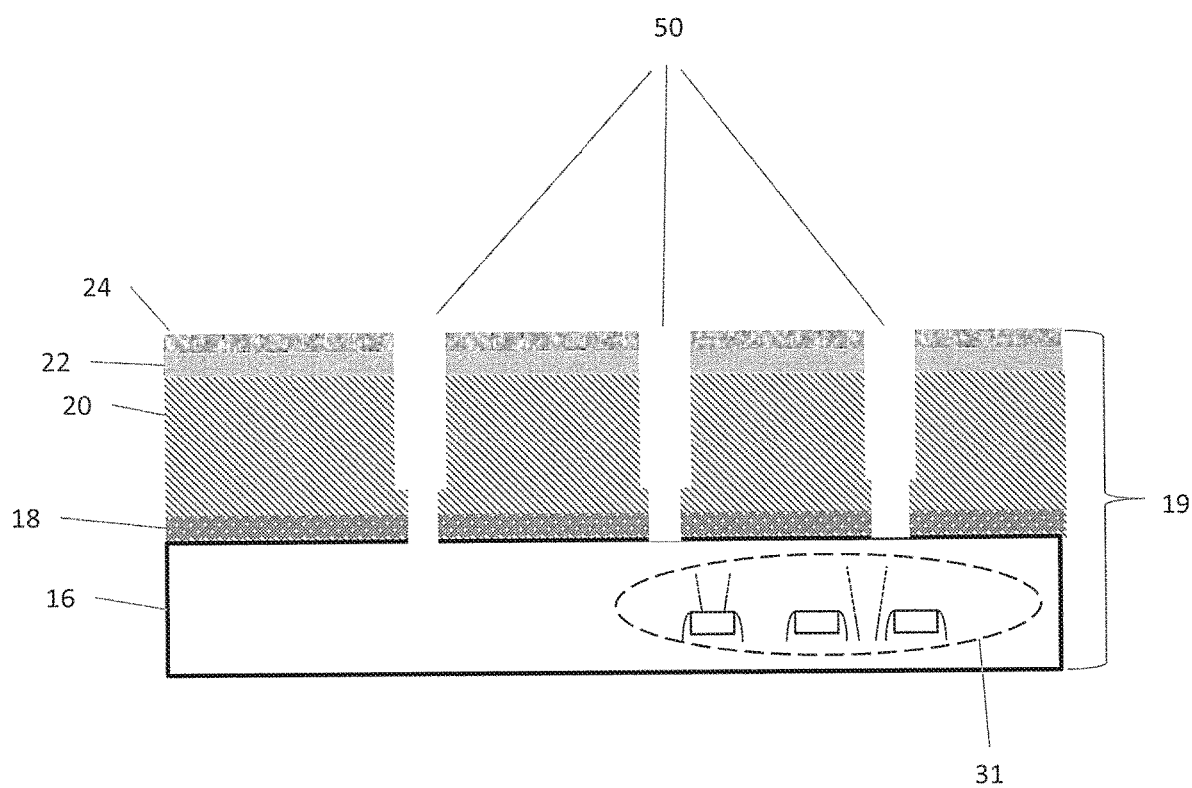

The pattern 50 is subsequently transferred through the second insulating film 38 and first insulating film 36, and the third insulating film 42 and metal hard mask layer 40 removed by using appropriate etchants and etching operations, as shown in FIG. 15. Adverting to FIG. 16, the pattern 50 is transferred into the exposed portion of the first bottom layer 34 and then the exposed low-k dielectric layer 20 is etched to expose the etch stop layer 18 in some embodiments. The exposed etch stop layer 18 is subsequently removed by etching using an appropriate etchant and etching operation to expose the semiconductor substrate 16 having semiconductor devices 31 formed thereon, as shown in FIG. 17. After removing the etch stop layer 18, the first bottom layer 34 is removed, as shown in FIG. 18.

The etching operations are carried out using appropriate etchants for each layer removed. For example, a fluorocarbon plasma etch is used to etch the first, second, and third insulating films 36, 38, 42 in some embodiments. The fluorocarbon plasma etch parameters, such as fluorocarbon flowrate and plasma power can be adjusted to tune the etch rate of the insulating films depending on the density of the insulating films. In other embodiments, the first, second and third insulating films 36, 38, 42 are etched using HF or buffered HF solutions. The metal hard mask 40 may be etched using a fluorine gas plasma, chlorine gas plasma, bromine gas plasma, or a combination of these plasmas. The first bottom layer 34 and second bottom layer 44 are etched using a $H_2SO_4/H_2O_2$ solution in some embodiments. In some embodiments, the etch stop layer 18 is etched using an HF solution or an $H_3PO_4$ solution. Overlying layers are removed after the vias are etched into underlying layers using suitable conventional removal techniques. For example, the first and second bottom layers 34, 44 are removed by ashing in some embodiments. In other embodiments, the first and second bottom layers 34, 44 are removed by a wet stripping operation using a suitable organic stripper.

Figure 19:
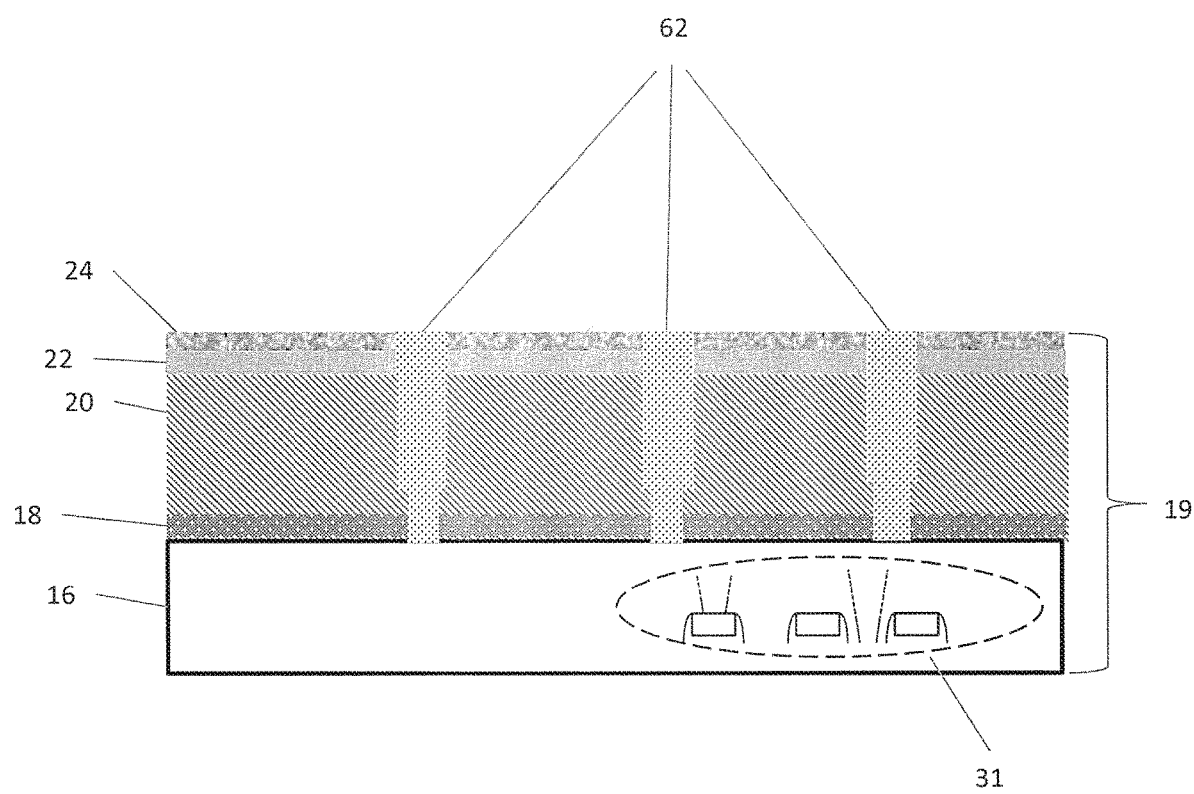

After removing the first bottom layer 34, a conductive material 62 is deposited in the pattern openings, as shown in FIG. 19, to form interconnects in contact with semiconductor devices 31 formed on the semiconductor substrate 16. The conductive material 62 is subsequently planarized by a CMP operation or etch-back operation. During planarization, the nitride layer 24 and anti-reflective layer 22 are removed in some embodiments. The conductive material 62 may be a metal deposited using conventional techniques including PVD, ALD, and electroplating. In certain embodiments, barrier layers, and metal seed layers are deposited in the vias, in addition to the interconnect conductive material. In certain embodiments, the barrier layer is a tantalum nitride or titanium nitride layer. In certain embodiments, the interconnect conductive material includes aluminum or copper.

It is understood that additional processing may be performed. Subsequent processing according to embodiments of the disclosure may also form various contacts/vias/lines and multilayer interconnects features (e.g., metal layers and interlayer dielectrics) on the device, configured to connect the various features or structures of the semiconductor device. For example, a multilayer interconnection includes vertical interconnects, such as conventional vias or contacts, and horizontal interconnects, such as metal lines.

Figure 20:
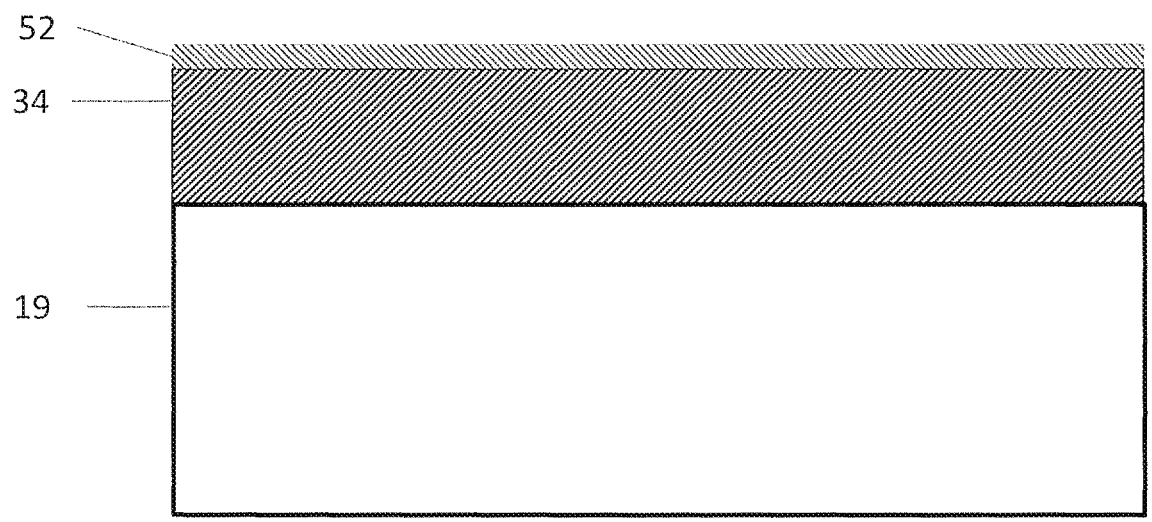
FIGS. 20-24 illustrate a method for manufacturing a semiconductor device according to another embodiment of the present disclosure.

In another embodiment of the disclosure, a first insulating film 52 is disposed over the first bottom layer 34, as shown in FIG. 20. The first insulating film 52 is formed by a low-temperature deposition process to form a tensile film having a first tensile stress. The low-temperature deposition process is performed at a temperature of about 100° C. to about 200° C. wherein the first insulating film 52 is formed at a first plasma power condition.

Figure 21:
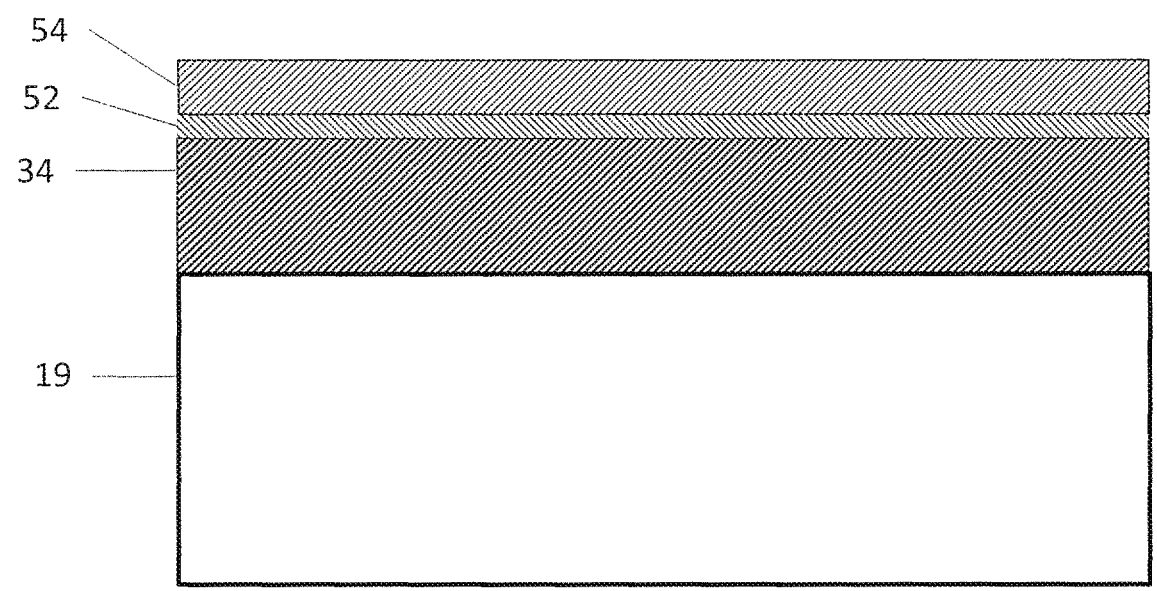

Adverting to FIG. 21, a second insulating film 54 is formed overlying the first insulating film 36 by a low-temperature deposition process to form a film having either a second tensile stress or a compressive stress at a second plasma condition, wherein the second plasma condition is at a higher power than the first plasma condition. In certain embodiments, the first plasma power condition ranges from about 50 W to about 500 W, and the second plasma power condition ranges from about 550 W to about 1000 W. In other embodiments, the second plasma power condition ranges from about 550 W to about 800 W. The second tensile stress is less than first tensile stress. In certain embodiments, the first insulating film 52 has a tensile stress ranging from about 75 MPa to about 25 MPa, and the second insulating film 54 has a tensile stress ranging from about 20 MPa to about −50 MPa.

The first insulating film 52 and second insulating film 54 may be formed of the same material. In certain embodiments, the first insulating film and second insulating film are oxide films, such as a silicon oxide film. The first insulating film 52 may have a thickness ranging from about 10 nm to about 50 nm, and the second insulating film 54 may have a thickness ranging from about 100 nm to about 500 nm.

Figure 22:
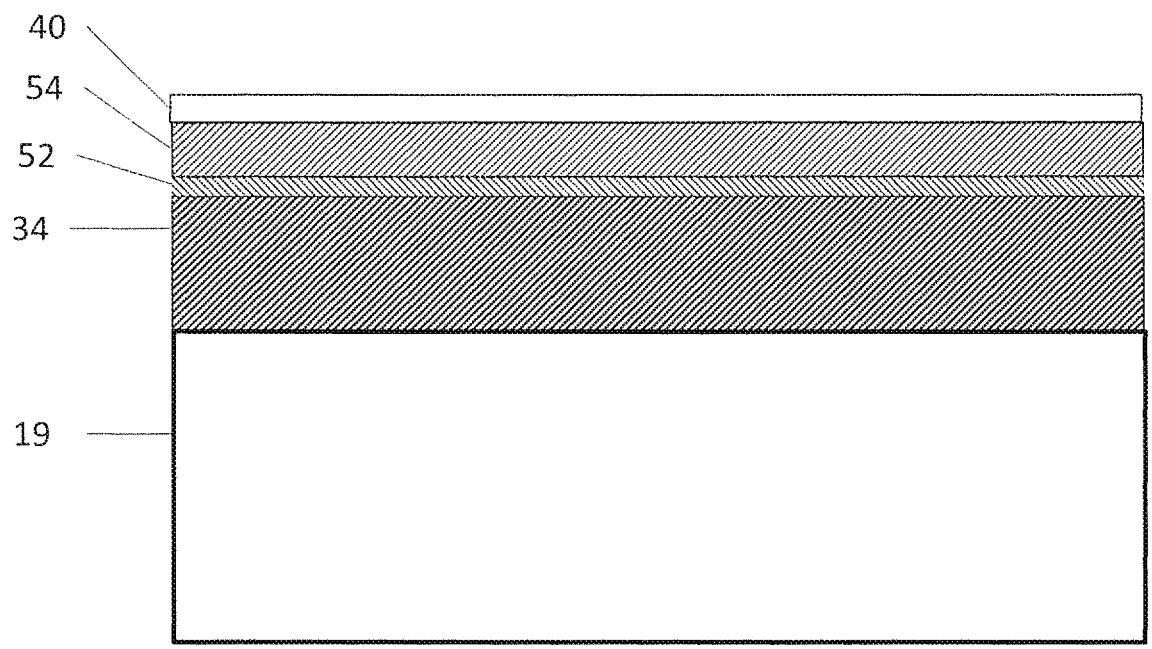

In a certain embodiment, a metal hard mask layer 40 is disposed overlying the second insulating film 54, as shown FIG. 22. The metal hard mask layer 40 may comprise titanium nitride deposited by a physical vapor deposition process. A thickness of the metal hard mask layer 40 may range from about 10 to about 50 nm.

Figure 23:
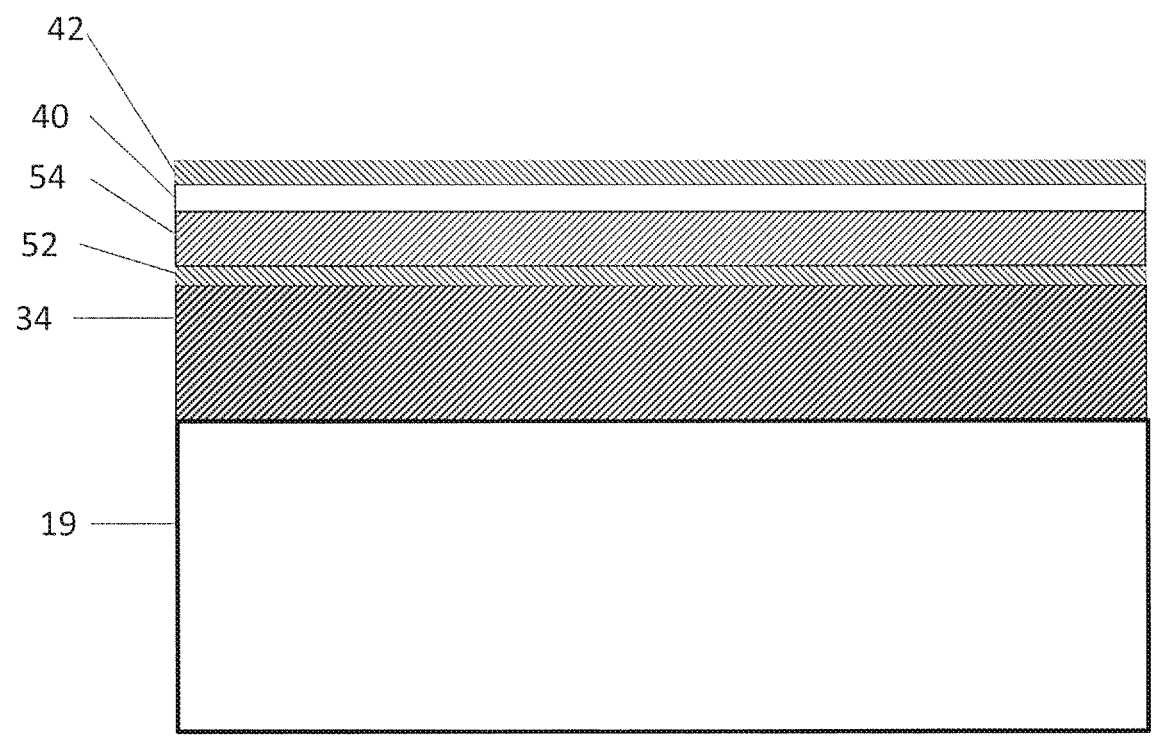

In some embodiments, a third insulating film 42 is formed on the metal hard mask layer 40, as shown in FIG. 23 to protect the metal hard mask layer 40. The third insulating film 42 may be the same material as the first and second insulating films 52, 54. The third insulating film 42 is formed by a low-temperature deposition process at a temperature of about 100° C. to about 200° C. A thickness of the third insulating film 42 may range from about 10 to about 50 nm.

The first, second, and third insulating films are formed in a single chamber, such as a single ALD chamber, a single CVD chamber, or a single PVD chamber in some embodiments. In other embodiments, the first, second, and third insulating films are formed in two or more different processing chambers.

Figure 24:
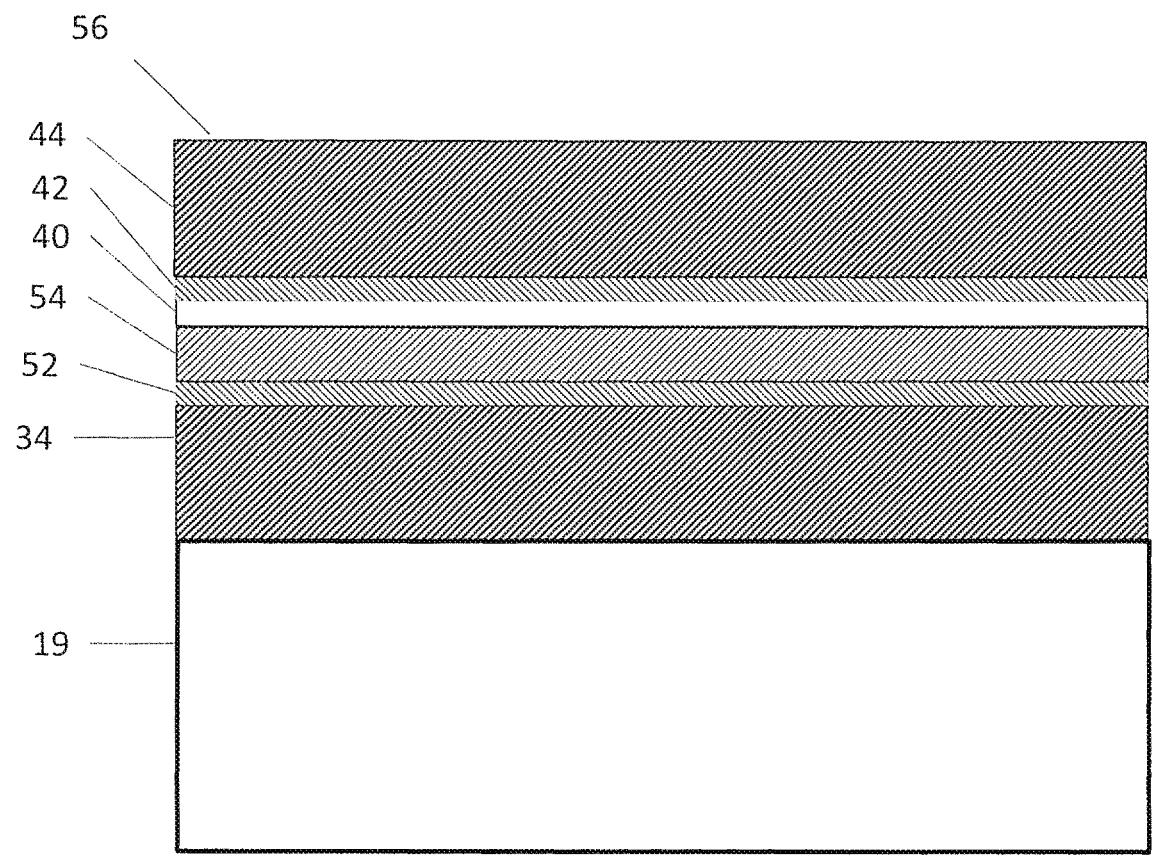

Adverting to FIG. 24, a second bottom layer 44 is formed on the third insulating film 42, thereby forming a bottom layer stack in certain embodiments. The second bottom layer 44 may be formed of an organic material, and may include the same composition as the first bottom layer 34. The thickness of the second bottom layer 44 may range from about 100 nm to about 500 nm. In certain embodiments, the thickness of the second bottom layer 44 is from 150 to 300 nm.

Subsequent operations of this embodiment of a manufacturing method for the semiconductor device may be the same as those of the other embodiments discussed herein, such as FIGS. 10-19.

An upper surface 56 of the second bottom layer 44 according to the present disclosure may have an RMS (root-mean-square) surface roughness ranging from 1 Å to 10 Å as a result of the low-temperature deposited insulating film, whereas the upper surface of a bottom layer of a conventional resist structure may have an RMS surface roughness of greater than 100 Å.

Figure 25:
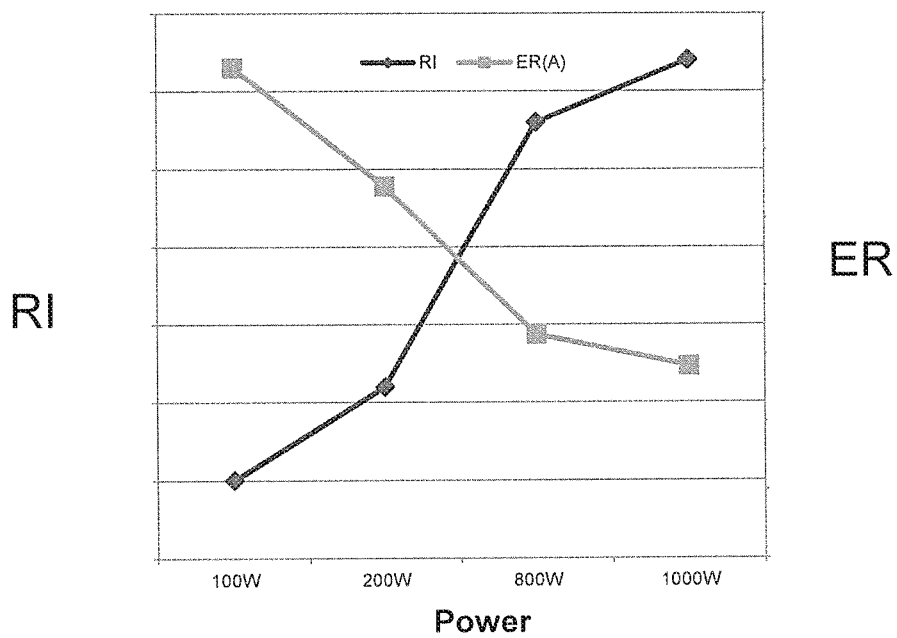
FIG. 25 illustrates the variation of etch rate and refractive indices of insulating films according to embodiments of the present disclosure.

The effect of increasing the plasma power on the first insulating film 52 and the second insulating film 54 is shown in graph in FIG. 25. As shown in FIG. 25, as the power is increased, the etch rate of the insulating films decreases and the refractive index of the insulating films increases. As the power is increased, the density of the deposited insulating films may increase, thereby increasing the refractive index and decreasing the etch rate of the insulating films. In certain embodiments, the power is adjusted to minimize wrinkling and optimize etch rate. While increasing the power increases the film density and decreases the etch rate, if the power is too high it can induce wrinkling.

The present disclosure substantially reduces bottom layer wrinkling, thereby improving pattern fidelity in via patterning for interconnect formation. The methods disclosed herein are adaptable to present manufacturing operations, and all the operations of multilayer LT-SiO$_2$ films can be formed in a single processing chamber.

One embodiment of the disclosure is a method for manufacturing a semiconductor device including forming a first insulating film over a semiconductor substrate and forming a second insulating film on the first insulating film. The first insulating film is a tensile film having a first tensile stress and the second insulating film is either a tensile film having a second tensile stress that is less than the first tensile stress or a compressive film. The first insulating film and second insulating film are formed of a same material. A metal hard mask layer is formed on the second insulating film.

Another embodiment of the disclosure is a method for manufacturing a semiconductor device, including forming a first insulating film over a semiconductor substrate and forming a second insulating film on the first insulating film. The first insulating film is formed at a first plasma power condition and the second insulating film is formed at a second plasma power condition. The second plasma power condition is a higher power than the first plasma power condition. The first insulating film and second insulating film are formed of a same material. A metal hard mask layer is formed on the second insulating film.

In another embodiment of the disclosure, a method for manufacturing a semiconductor device includes forming a first insulating film over a semiconductor substrate and forming a second insulating film on the first insulating film. The first insulating film is a tensile film having a first tensile stress, the second insulating film is either a tensile film having a second tensile stress that is less than the first tensile stress or a compressive film, and the first insulating film and second insulating film are formed of a same material. A metal hard mask layer is formed on the second insulating film, and a third insulating film is formed on the metal hard mask layer. The first, second, and third insulating films are formed at a temperature of about 100° C. to about 200° C. The first insulating film is formed at a first plasma power condition and the second insulating film is formed at a second plasma power condition. The second plasma power condition is a higher power than the first plasma power condition, and the first insulating film and second insulating film are formed of a same material.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor device, comprising:
   forming a bottom organic layer over a semiconductor substrate;
   forming a first insulating film over the bottom organic layer;
   forming a second insulating film over the first insulating film,
   wherein the first insulating film is a tensile film having a first tensile stress, the second insulating film is either a tensile film having a second tensile stress that is less than the first tensile stress or a compressive film, and the first insulating film and second insulating film are formed of a same material;
   forming a metal hard mask layer over the second insulating film; and
   completely removing the bottom organic layer after forming the metal hard mask layer.

2. The method according to claim 1, wherein the first insulating film and second insulating film are oxide films.

3. The method according to claim 2, wherein the first insulating film and second insulating film comprise silicon oxide.

4. The method according to claim 1, further comprising forming a third insulating film over the metal hard mask layer.

5. The method according to claim 1, further comprising patterning the first insulating film, second insulating film, and metal hard mask layer.

6. The method according to claim 5, wherein the first insulating film, second insulating film, and metal hard mask layer are patterned by etching.

7. The method according to claim 1, wherein the first insulating film and second insulating film are formed at a temperature of 100° C. to 200° C.

8. A method for manufacturing a semiconductor device, comprising:
- forming an anti-reflective bottom organic layer over a semiconductor substrate,
- wherein the anti-reflective bottom organic layer comprises a carbon backbone polymer or monomers;
- forming a first insulating film having a first tensile stress over the bottom organic layer;
- forming a second insulating film of a same material as the first insulating film and having a second tensile stress less than the first tensile stress over the first insulating film;
- forming a metal hard mask layer over the second insulating film;
- forming a third insulating film over the metal hard mask layer;
- completely removing the bottom organic layer after forming the metal hard mask layer; and
- removing the metal hard mask layer.

9. The method according to claim 8, wherein the first insulating film and second insulating film are oxide films.

10. The method according to claim 9, wherein the first insulating film and second insulating film comprise silicon oxide.

11. The method according to claim 8, wherein the first insulating film and second insulating film are formed at a temperature of 100° C. to 200° C.

12. The method according to claim 8, wherein the first and third insulating films have a thickness ranging from 10 nm to 50 nm, and the second insulating film has a thickness ranging from 100 nm to 500 nm.

13. The method according to claim 8, wherein the metal hard mask layer comprises titanium nitride.

14. A method for manufacturing a semiconductor device, comprising:
- forming an anti-reflective bottom organic layer over a semiconductor substrate,
- wherein the anti-reflective bottom organic layer is used for patterning and the anti-reflective bottom organic layer comprises a carbon backbone polymer or monomers;
- forming a first insulating film over the bottom organic layer;
- forming a second insulating film of a same material as the first insulating film directly on the first insulating film;
- forming a metal hard mask layer over the second insulating film;
- forming a third insulating film over the metal hard mask layer;
- forming a layer of organic material over the third insulating layer; and
- completely removing the anti-reflective bottom organic layer after forming the metal hard mask layer.

15. The method according to claim 14, wherein the first insulating film and second insulating film are oxide films.

16. The method according to claim 15, wherein the first insulating film and second insulating film comprise silicon oxide.

17. The method according to claim 14, wherein the first insulating film and second insulating film are formed at a temperature of 100° C. to 200° C.

18. The method according to claim 14, wherein the first and third insulating films have a thickness ranging from 10 nm to 50 nm, and the second insulating film has a thickness ranging from 100 nm to 500 nm.

19. The method according to claim 14, wherein the metal hard mask layer comprises titanium nitride.

20. The method according to claim 14, wherein the layer of organic material comprises a carbon backbone polymer or monomers.

* * * * *